US010686014B2

(12) United States Patent
Li et al.

(10) Patent No.: US 10,686,014 B2
(45) Date of Patent: Jun. 16, 2020

(54) SEMICONDUCTOR MEMORY DEVICE HAVING A VERTICAL ACTIVE REGION

(71) Applicant: International Business Machines Corporation, Armonk, NY (US)

(72) Inventors: Juntao Li, Cohoes, NY (US); Kangguo Cheng, Schenectady, NY (US); Takashi Ando, Tuckahoe, NY (US); Dexin Kong, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/018,384

(22) Filed: Jun. 26, 2018

(65) Prior Publication Data

US 2019/0393269 A1    Dec. 26, 2019

(51) Int. Cl.
*H01L 27/24* (2006.01)
*H01L 45/00* (2006.01)

(52) U.S. Cl.
CPC .......... *H01L 27/2481* (2013.01); *H01L 45/08* (2013.01); *H01L 45/1233* (2013.01); *H01L 45/1253* (2013.01); *H01L 45/146* (2013.01); *H01L 45/147* (2013.01); *H01L 45/16* (2013.01)

(58) Field of Classification Search
CPC .............. H01L 23/5226; H01L 23/528; H01L 27/2418; H01L 27/2463; H01L 45/06; H01L 45/08; H01L 45/1233; H01L 45/146; H01L 45/147; H01L 45/1675; H01L 27/2481; H01L 45/1253; H01L 45/16
See application file for complete search history.

(56) References Cited

U.S. PATENT DOCUMENTS

| 9,059,391 | B2 | 6/2015 | Hou et al. |
| 9,147,836 | B2 | 9/2015 | Greene et al. |
| 9,299,392 | B2 | 3/2016 | Lee et al. |
| 9,305,624 | B2 | 4/2016 | Shepard |
| 9,502,466 | B1 * | 11/2016 | Chuang ................. H01L 27/222 |

(Continued)

FOREIGN PATENT DOCUMENTS

WO    2016204420 A1    12/2016

OTHER PUBLICATIONS

Adam, G. C., Chrakrabarti, B., Nili, H. et al. (2017). 3D ReRAM arrays and crossbars: Fabrication, characterization and applications. Nanotechnology (IEEE-NANO), 2017 IEEE 17th International Conference on, pp. 844-849.

(Continued)

*Primary Examiner* — Mohammed Shamsuzzaman
(74) *Attorney, Agent, or Firm* — Cantor Colburn LLP; Vazken Alexanian

(57) ABSTRACT

Embodiments of the invention provide a semiconductor memory device. In some embodiments, the device includes a bottom electrode extending in a y-direction relative to top surface of a substrate and a top electrode extending in an x-direction relative to the top surface of the substrate. An active area is located at the cross-section between the bottom electrode and the top electrode and is located on vertical side walls extending in a z-direction of the semiconductor memory device with respect to the top surface of the substrate. An insulating layer is located in the active area in between the top electrode and the bottom electrode.

14 Claims, 9 Drawing Sheets

(56) References Cited

U.S. PATENT DOCUMENTS

| | | | |
|---|---|---|---|
| 9,520,557 B2 | 12/2016 | Lu et al. | |
| 9,520,562 B2 | 12/2016 | Xie et al. | |
| 9,716,223 B1* | 7/2017 | Chen | H01L 45/1233 |
| 9,799,706 B2* | 10/2017 | Park | H01L 45/1233 |
| 9,929,171 B2 | 3/2018 | Aoyama | |
| 2009/0026618 A1* | 1/2009 | Kim | H01L 21/76843 |
| | | | 257/751 |
| 2013/0224929 A1* | 8/2013 | Ko | H01L 45/06 |
| | | | 438/382 |
| 2013/0234094 A1* | 9/2013 | Chang | H01L 45/04 |
| | | | 257/4 |
| 2015/0102459 A1* | 4/2015 | Lai | H01L 22/14 |
| | | | 257/532 |
| 2016/0013405 A1* | 1/2016 | Kim | H01L 45/1253 |
| | | | 711/118 |
| 2016/0020269 A1* | 1/2016 | Yang | H01L 22/14 |
| | | | 438/18 |
| 2016/0049447 A1* | 2/2016 | Jung | H01L 27/2463 |
| | | | 257/4 |
| 2016/0064664 A1 | 3/2016 | Dang et al. | |
| 2016/0087199 A1* | 3/2016 | Jang | H01L 45/04 |
| | | | 257/4 |
| 2016/0148990 A1* | 5/2016 | Tu | H01L 28/60 |
| | | | 438/382 |
| 2016/0268506 A1* | 9/2016 | Huang | H01L 45/1253 |
| 2017/0117467 A1* | 4/2017 | Chang | H01L 45/08 |
| 2017/0309682 A1* | 10/2017 | Chou | H01L 27/2463 |
| 2019/0043795 A1* | 2/2019 | Chen | H01L 23/53261 |
| 2019/0136207 A1* | 5/2019 | Ramaswamy | H01L 27/10808 |
| 2019/0238135 A1* | 8/2019 | Lin | G11C 11/1673 |

OTHER PUBLICATIONS

Tseng, Y. T., Chen, P. H., Chang, T. C. et al. (2017). Solving the Scaling Issue of Increasing Forming Voltage in Resistive Random Access Memory Using High-k Spacer Structure. Advanced Electronic Materials, 3(9).

Zhou, J., Kim, K. H., & Lu, W. (2014). Crossbar RRAM arrays: Selector device requirements during read operation. IEEE Transactions on Electron Devices, 61(5), pp. 1369-1376.

List of IBM Patents or Patent Applications Treated as Related; Date Filed: Nov. 25, 2019, 2 pages.

* cited by examiner

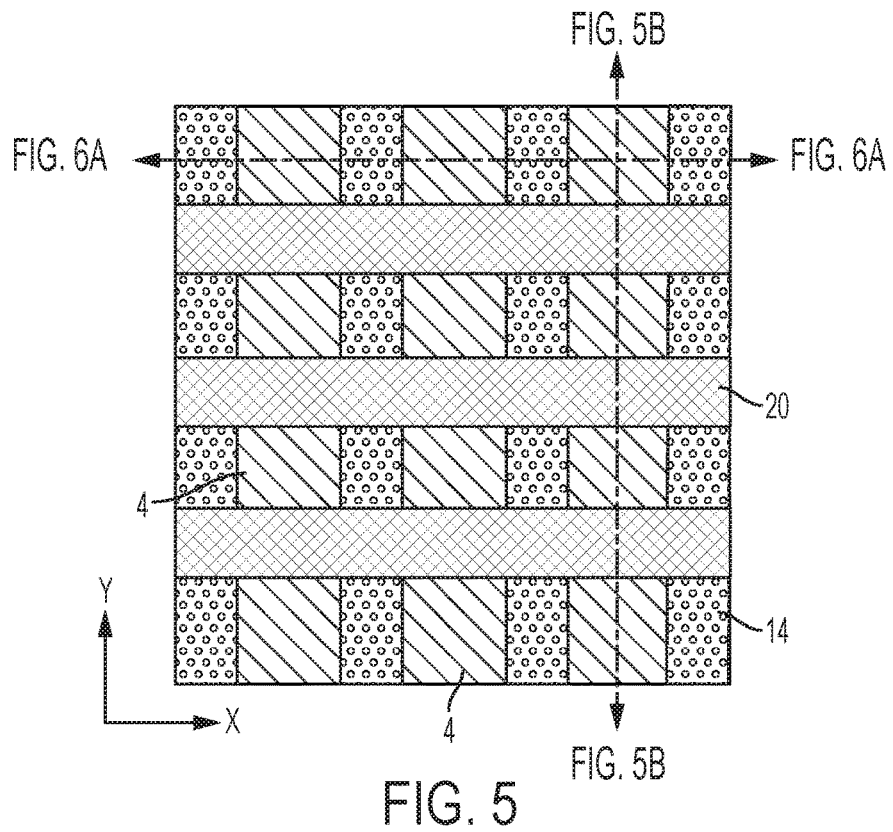
FIG. 5
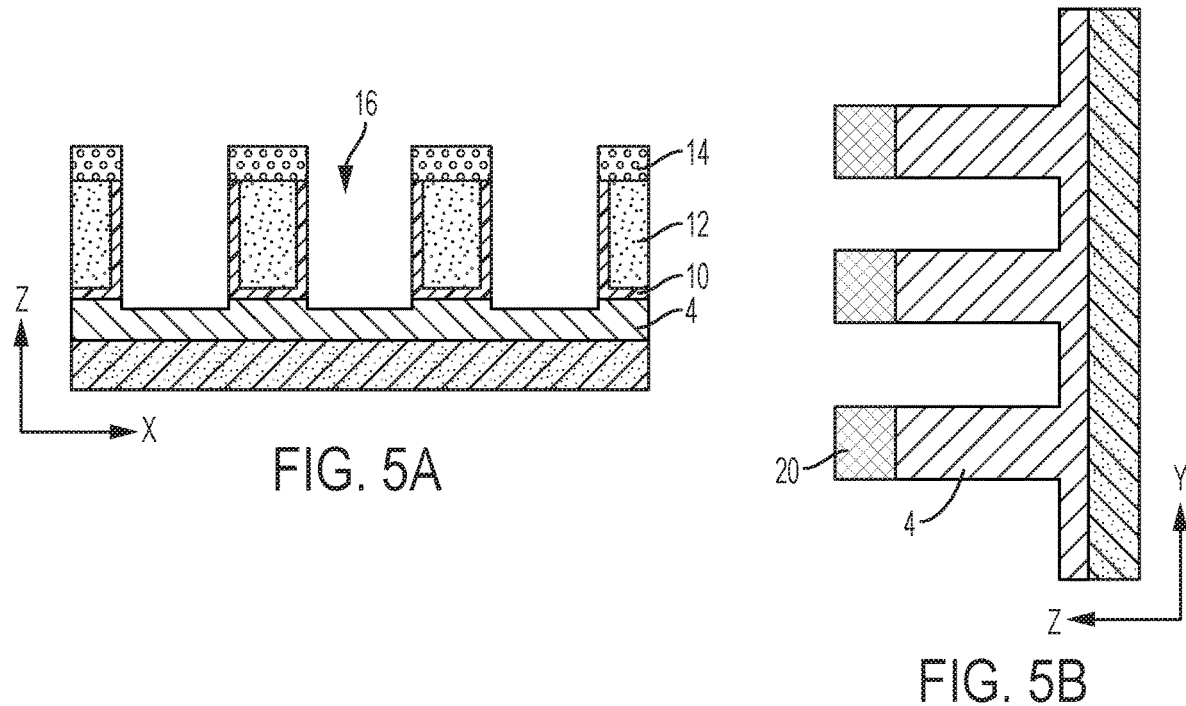
FIG. 5A
FIG. 5B

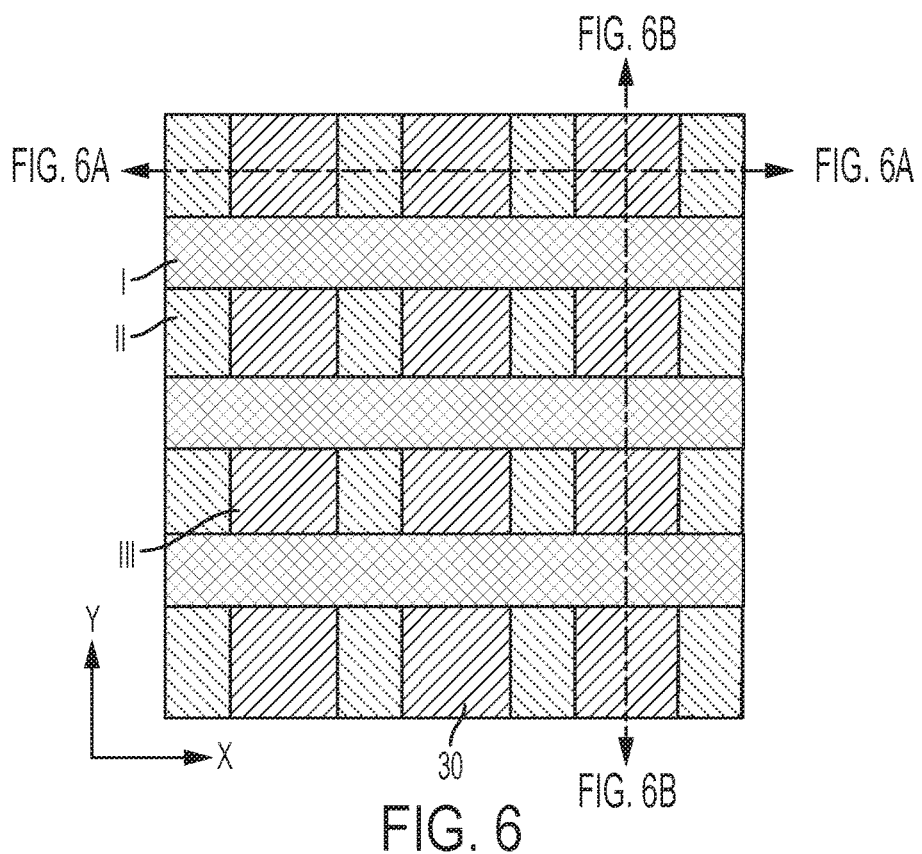
FIG. 6
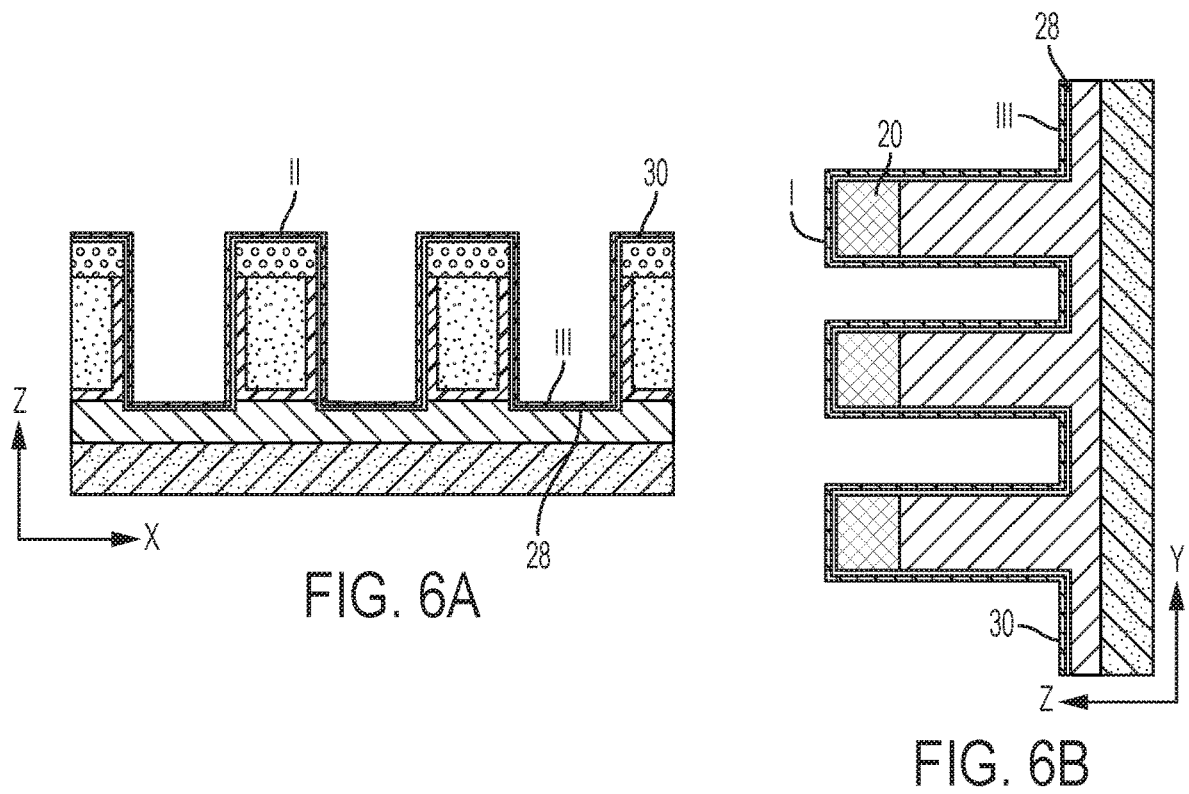
FIG. 6A
FIG. 6B

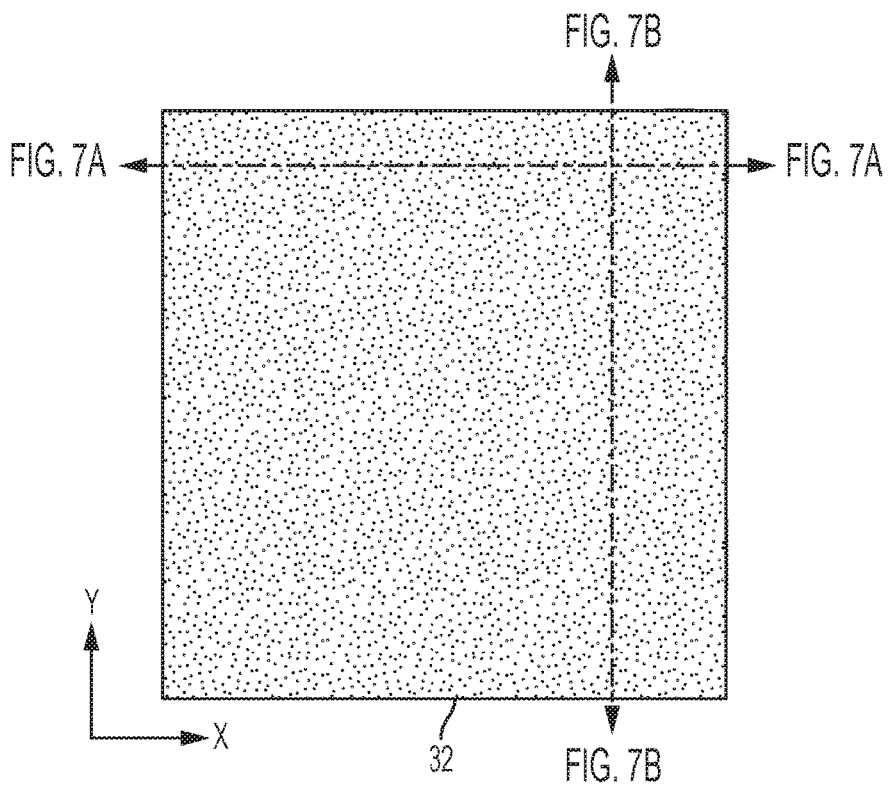
FIG. 7
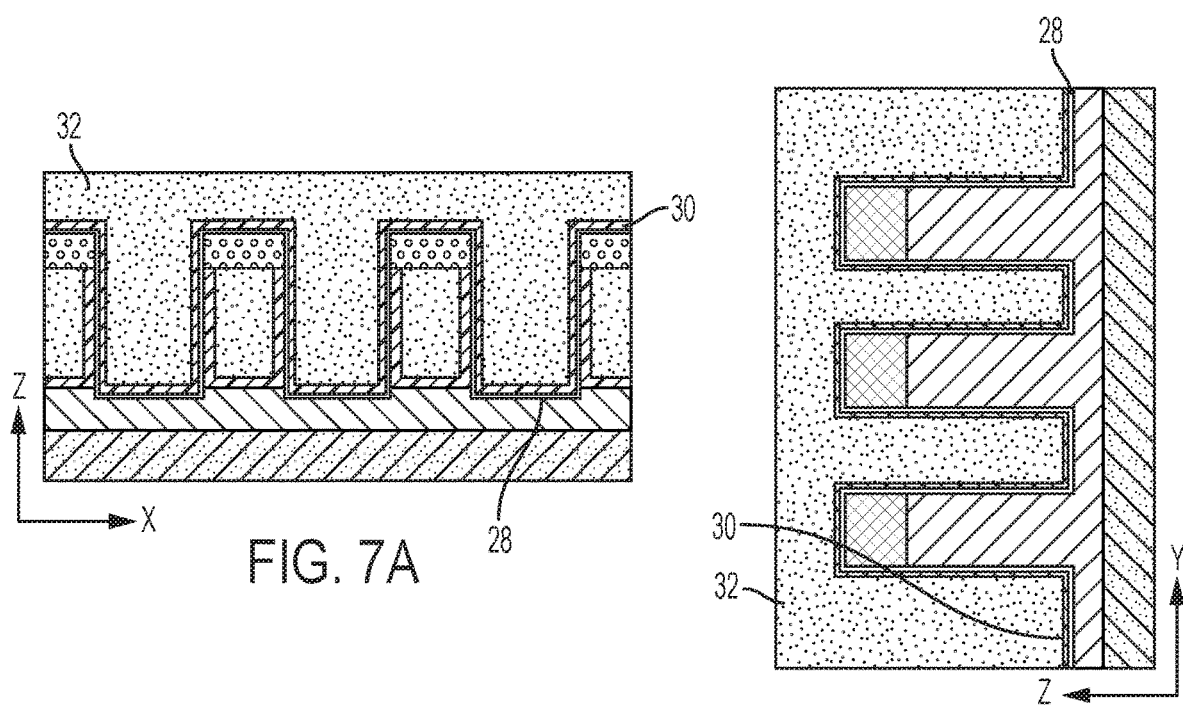
FIG. 7A
FIG. 7B

SEMICONDUCTOR MEMORY DEVICE HAVING A VERTICAL ACTIVE REGION

BACKGROUND

The present invention relates in general to fabrication methods and resulting structures for semiconductor devices. More specifically, the present invention relates to fabrication methods and resulting structures for semiconductor memory devices having vertical active regions.

As the functionality of integrated chips increases, the need for more memory also increases. Designers have been looking to decrease the size of the memory elements and to stack more memory elements in a unit area to achieve greater capacity and lower costs per bit. With advancements in lithographic techniques, significant shrinkage of memory elements has been achieved. For example, flash memory can achieve high density by using 3D arrays, such as using vertical NAND cell stacking. Due to its high density, flash memory has been widely used as a large-capacity, nonvolatile memory, which can store data when it is powered off. However, it has been found that further miniaturization of the flash memory is limited as production costs have become increasingly high.

Designers are now looking at next generation nonvolatile memories such as MRAMs (Magnetoresistive Random Access Memory), PCRAMs (Phase Change Random Access Memory), CBRAMs (Conductive Bridging Random Access Memory) and RRAMs (Resistive Random Access Memory), to increase writing speed and decrease power consumption. Among the nonvolatile memories, the RRAM has the most potential to replace flash memories due to its simple structure, simple crossbar array and ability for low-temperature fabrication. A unit element of the RRAM is a two-terminal device composed of only an insulator positioned between two metal electrodes. For example, in a RRAM, a memristor element (e.g., HfOx) is sandwiched between two electrodes. Defects (e.g., oxygen vacancies) are intentionally introduced in the memristor film that can be programmed to different logic states such as a low-resistance state (logic "1") or a high-resistance state (logic "0") by changing the polarity of electrical field across the memristor element.

SUMMARY

According to an embodiment of the present invention, a semiconductor memory device includes a bottom electrode extending in a y-direction relative to top surface of a substrate and a top electrode extending in an x-direction relative to the top surface of the substrate. An active area is located at the cross-section between the bottom electrode and the top electrode and the active area is located on vertical side walls extending in a z-direction of the semiconductor memory device with respect to the top surface of the substrate. An insulating layer is located in the active area in between the top electrode and the bottom electrode.

According to another embodiment, a method of forming the device includes selectively etching a plurality bottom electrode regions extending in a y-direction of a substrate and depositing a bottom electrode in each of the bottom electrode regions. A cap layer is deposited onto a top surface of the bottom electrode and a plurality of orthogonal mask regions extending in an x-direction of the substrate orthogonal to the bottom electrode regions is deposited on the surface. The plurality of unprotected areas of the substrate are selectively etched to form an etched surface and an insulating layer is deposited on the etched surface. A top electrode is deposited on the insulating layer to form a metal surface and the metal surface is planarized to expose an upper surface of the plurality of the orthogonal mask regions.

BRIEF DESCRIPTION OF THE DRAWINGS

Refer now to the figures, which are exemplary embodiments of the invention, and wherein the like elements are numbered alike.

FIGS. 1-9 illustrate various views of a semiconductor structure after fabrication operations have been performed on the semiconductor structure to form a vertical crossbar semiconductor memory device according to embodiments of the invention, in which:

FIG. 1 is a cross-sectional view of the semiconductor structure after fabrication operations in which a patterned mask has been formed on a substrate;

FIG. 2 is a cross-sectional view of the semiconductor structure after fabrication operations in which an etch has been applied to form bottom electrode regions;

FIG. 3 is a cross-sectional view of the semiconductor structure after fabrication operations in which a bottom electrode has been formed in the bottom electrode regions;

FIG. 4 is a top-down view of an x-y plane of the surface of the semiconductor structure after fabrication operations in which a plurality of orthogonal mask lines has been formed;

FIG. 5 is a top-down view of an x-y plane of the surface of the semiconductor structure after fabrication operations in which the surface has been selectively etched;

FIG. 5A is a cross-sectional view at line F5A of FIG. 5 in the x-z plane;

FIG. 5B is a cross-sectional view at line F5B of FIG. 5 in the y-z plane;

FIG. 6 is a top-down view of an x-y plane of the surface of the semiconductor device in which a top electrode conductive layer has been deposited;

FIG. 6A is a cross-sectional view at line F6A of FIG. 6 in the x-z plane;

FIG. 6B is a cross-sectional view at line F6B of FIG. 6 in the y-z plane;

FIG. 7 is a top-down view of an x-y plane of the surface of the semiconductor device in which a top electrode metal layer has been deposited;

FIG. 7A is a cross-sectional view at line F7A of FIG. 7 in the x-z plane;

FIG. 7B is a cross-sectional view at line F7B of FIG. 7 in the y-z plane;

FIG. 8 is a top-down view of an x-y plane of the surface of the semiconductor device in which a top electrode conductive layer has been deposited;

FIG. 9 is a top-down view of an x-y plane of the surface of the semiconductor device.

DETAILED DESCRIPTION

Figure 1:
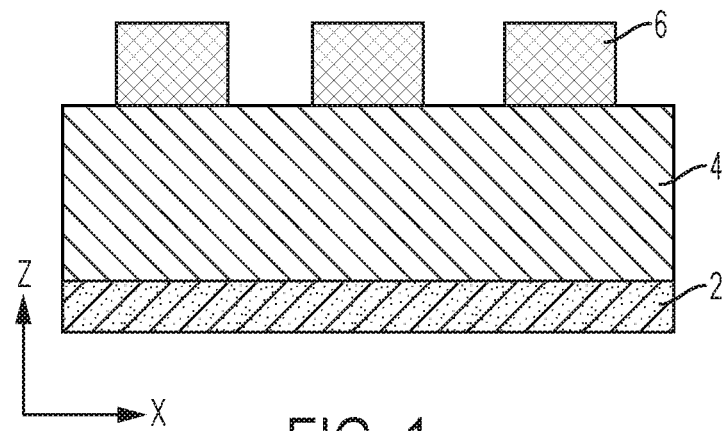

A description of the semiconductor memory device fabrication processes that can be utilized in implementing one or more embodiments of the present invention will now be provided. Although specific fabrication operations used in implementing one or more embodiments of the present invention can be individually known, the present combination of operations and/or resulting structures of the present invention are unique. Thus, the unique combination of the operations described in connection with the present invention utilize a variety of individually known physical and chemical processes performed on a semiconductor (e.g., silicon) substrate, some of which are described in the immediately following paragraphs.

In general, the various processes used to form the device fall into three general categories, namely, deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etch processes (either wet or dry), and chemical-mechanical planarization (CMP), and the like.

For the sake of brevity, conventional techniques related to semiconductor device may or may not be described in detail herein. Moreover, the various tasks and process steps described herein can be incorporated into a more comprehensive procedure or process having additional steps or functionality not described in detail herein. In particular, various steps in the manufacture of semiconductor devices are well known and so, in the interest of brevity, many conventional steps will only be mentioned briefly herein or will be omitted entirely without providing the well-known process details.

A typical RRAM storage cell is a two-terminal device formed as a metal-insulator-metal (MIM) structure, which is a simpler construction than the three terminal storage cells used in conventional CMOS-based DRAM or flash memory. The insulator material in the MIM device can be a binary metal oxide, which makes fabricating a MIM RRAM storage cell compatible with silicon-based CMOS fabrication process. The resistance of a RRAM storage cell serves as the switchable conduction state that stores data. When a sufficient electrical field/signal is applied across the metal electrodes of a MIM, the resistance of the insulator can be switched from one resistance state to another through various mechanisms, including the formation and rupture of one-dimensional conductive filaments formed in the metal oxide during electroforming. The formation and rupture of the conducting filaments involves various reduction-oxidation (redox) reactions and depends on the metal/electrode material. The oxygen vacancy concentration ($V_O$) in the oxide of the binary metal oxide and the state of the insulator/electrode interface are significant factors in controlling the resistive switching mechanism in a MIM memory cell.

Because each MIM RRAM storage cell uses only two external terminals, these memories can be accommodated in an array (e.g., a crossbar array), which is compatible with a variety of electronic circuits and devices, including ultra-high density NVM and artificial neural network (ANN) architectures. A basic array includes a set of conductive row electrodes and a set of conductive column electrodes formed to intersect the set of conductive row electrodes. The intersections between the two sets of electrode lines are separated by a so-called "cross-point" device, which, in RRAM memory circuits, can be implemented as a two-terminal MIM device. The conduction state (e.g., resistance) of the MIM insulator can be altered by controlling the voltages applied between individual electrode lines of the row and column electrode lines. Digital data can be stored by alteration of the insulator material's conduction state at the intersection to achieve a high conduction state (or low resistance state (LRS)) or a low conduction state (or high resistance state (HRS)). The MIM insulator material can also be programmed to maintain two or more distinct conduction states by selectively setting the conduction state of the material. The conduction state of the memristor material can be read by applying a voltage across the material and measuring the current that passes through the target crosspoint device.

In neuromorphic computing applications (e.g., ANN), a MIM device can be used as a connection (synapse) between a pre-neuron and a post-neuron, thus representing the connection weight in the form of device resistance. Neuromorphic systems are interconnected processor elements that act as simulated "neurons" and exchange "messages" between each other in the form of electronic signals. Similar to the so-called "plasticity" of synaptic neurotransmitter connections that carry messages between biological neurons, the connections in neuromorphic systems such as ANNs carry electronic messages between simulated neurons, which are provided with numeric weights that correspond to the strength or weakness of a given connection. The weights can be adjusted and tuned based on experience, making neuromorphic systems adaptive to inputs and capable of learning. For example, a neuromorphic/ANN for handwriting recognition is defined by a set of input neurons, which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read. Multiple pre-neurons and post-neurons can be connected through an array of RRAMs, which naturally expresses a fully-connected neural network.

It is desirable to reduce the footprint of RRAM MIM cells in order to fit more RRAM MIM cells in/on an array/chip. Accordingly, embodiments of the invention provide fabrication methods and resulting structures for a semiconductor memory device (also referred to herein as a memory device or a device) in which the active area for each cell in the device is vertical, which beneficially allows for a reduction in the footprint area while maintaining sufficiently large active area. For ease of reference, the novel semiconductor memory device according to aspects of the invention is referenced herein as a vertical crossbar semiconductor memory device.

Figure 10:
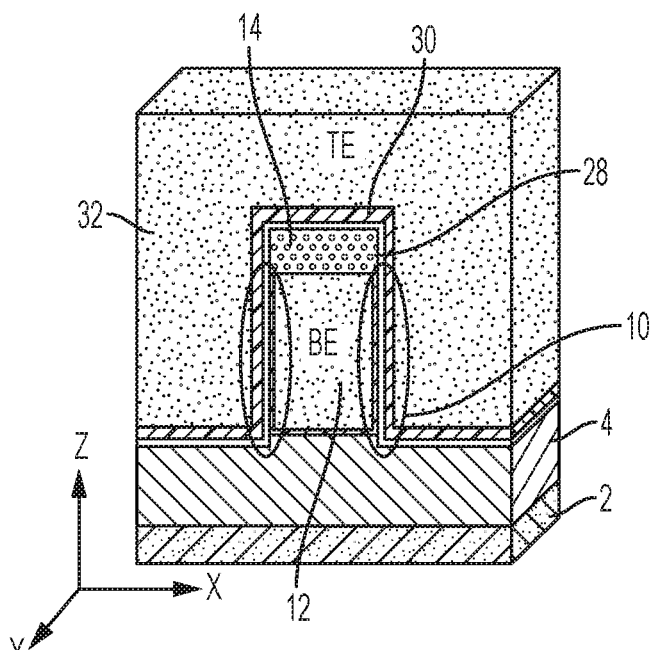
FIG. 10 is a three-dimensional view of memory cell in the semiconductor device.

FIG. 10 is a three-dimensional (3D) view of a portion of a vertical crossbar semiconductor memory 100 showing a single vertical memory cell in accordance with aspects of the invention. As shown in FIG. 10, the vertical memory cell includes active areas (encircled) positioned between a bottom electrode stack 10, 12 and a top electrode stack 30, 32. In accordance with aspects of the invention, the active areas high-aspect ratio structures that extend vertically (in the z-direction) relative to an x-y plane of the substrate 2. The bottom electrode stack includes a bottom electrode metal layer 12 and a bottom electrode conductive layer 10, and the top electrode stack includes a top electrode metal layer 32 and top electrode conductive layer 30. An insulating layer 28 is located in between the bottom electrode stack 10, 12 and the top electrode stack 30, 32.

FIGS. 1-9 illustrate a fabrication method according to aspects of the invention by showing various views of a semiconductor structure after fabrication operations have been performed thereon to form the vertical crossbar semiconductor memory 100 (shown in FIG. 10). In FIG. 1, known fabrication operations have been used to pattern a mask layer 6 on the substrate 2. In embodiments of the invention, the substrate 2 can include an underlayer 4 that is located on a surface of the substrate 2.

The substrate 2 can have a thickness of 0.1 to 750 micrometers. The substrate 2 can include bulk Si and can have a thickness of 700 to 800 micrometers. The substrate 2 can include silicon (Si), strained silicon, silicon carbide (SiC), germanium (Ge), silicon germanium (SiGe), silicon-germanium-carbon (SiGeC), a silicon alloy, a germanium alloy, gallium arsenide (GaAs), indium arsenide (InAs), indium phosphide (InP), cadmium arsenide, cadmium selenide, or a combination including at least one of the foregoing.

The substrate 2 is illustrated as a bulk semiconductor but can be implemented to include a semiconductor-on-insulator (SOI) and can have a thickness of 5 to 200 nanometers. The SOI implementation of the substrate 2 includes an insulator layer, which can be a buried oxide (BOX) layer.

The bulk semiconductor layer that forms the substrate 2 can be formed by chemical vapor deposition (CVD), liquid phase (LP) chemical vapor deposition, reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The thickness of the semiconductor layer can be 5 to 200 nanometers.

The underlayer 4 can be formed from the same or different material as the substrate 2 and can include one or more transistors, wiring, and the like located on the substrate 2. As used herein it is noted that the underlayer 4 is describing the layer being etched to form the bottom electrode stack 10, 12 (shown in FIG. 10). Underlayer 4 can be a top portion of the substrate 2.

Mask layer 6 can be deposited on underlayer 4. The mask material can include a resist such as a photoresist and the substrate 2 can be patterned by photolithography. An optional adhesion layer can be formed on top of the substrate 2 prior to applying the mask material. In another embodiment, the patterned mask layer can be hardmask layer (such as, silicon nitride or silicon oxynitride) formed by depositing the layer(s) of material that include the patterned hard mask layer and thereafter directly patterning the patterned hard mask layer using known photolithography and etching techniques. The particular form and composition of the patterned hard mask layer 6 and the manner in which it is made should not be considered a limitation of the present invention.

The mask layer 6 can then be patterned to form features that will protect regions of the underlayer 4. The patterned mask can form, for example, thin walls extending lengthwise in the y-direction.

Figure 2:
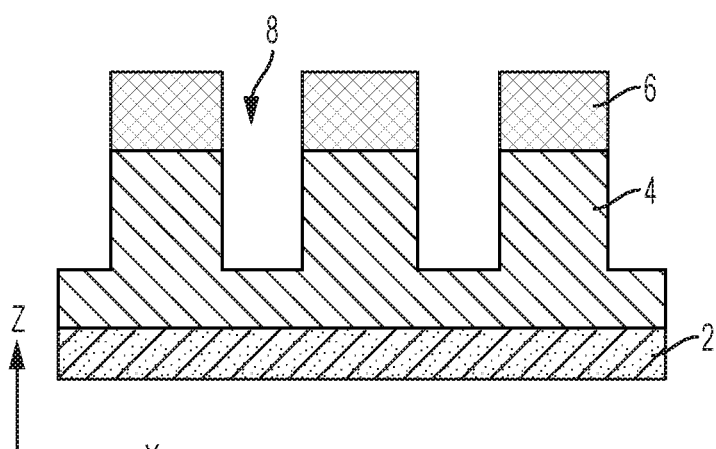

In FIG. 2, the unprotected region has been etched away in an etching operation to pattern underlayer 4 to form bottom electrode regions 8, and the mask layer 6 can be removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a thereof. In the case of the nitride hardmask layer, suitable wet etch solutions, such as phosphoric acid can be used to etch silicon nitride to remove the hardmask material. A width of the bottom electrode regions 8 in the x-direction can be 5 to 60 nm, specifically, 20 to 40 nm or 40 to 60 nm, e.g., 50 nm.

Figure 3:
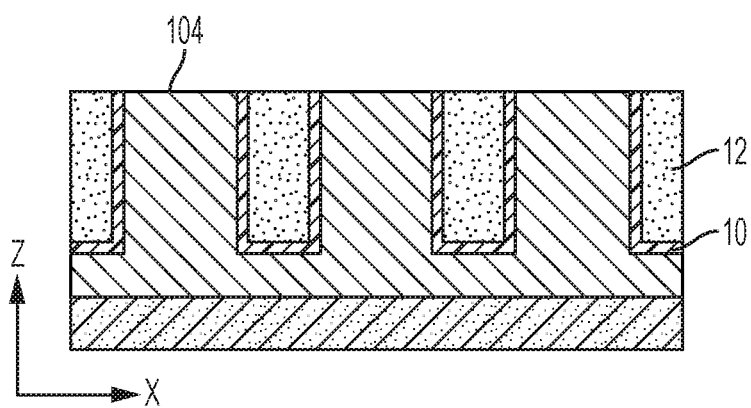

FIG. 3 illustrates that the bottom electrode can then be formed in bottom electrode regions 8 by first depositing bottom electrode conductive layer 10 and then depositing bottom electrode metal layer 12. The bottom electrode conductive layer 10 can include a metal nitride (for example, titanium nitride, tantalum nitride, titanium aluminum nitride, or tungsten nitride), or a metal-semiconductor compound (for example, a metal silicide), or a combination including at least one of the foregoing. The metal silicide can include nickel silicide, cobalt silicide, tungsten silicide, titanium silicide, tantalum silicide, platinum silicide, erbium silicide, or a combination including at least one of the foregoing. Specifically, the bottom electrode conductive layer 10 can include titanium nitride. A thickness of the bottom electrode conductive layer 10 can be 1 to 10 nanometers, specifically, 2 to 5 nanometers. The bottom electrode metal layer 12 can include titanium, tantalum, tungsten, molybdenum, platinum, hafnium, copper, aluminum, gold, nickel, iridium, or a combination including at least one of the foregoing; specifically, tungsten.

After deposition of bottom electrode, the surface can undergo chemical mechanical planarization to planarize the surface and to expose upper surface 104 of underlayer 4.

Figure 4:
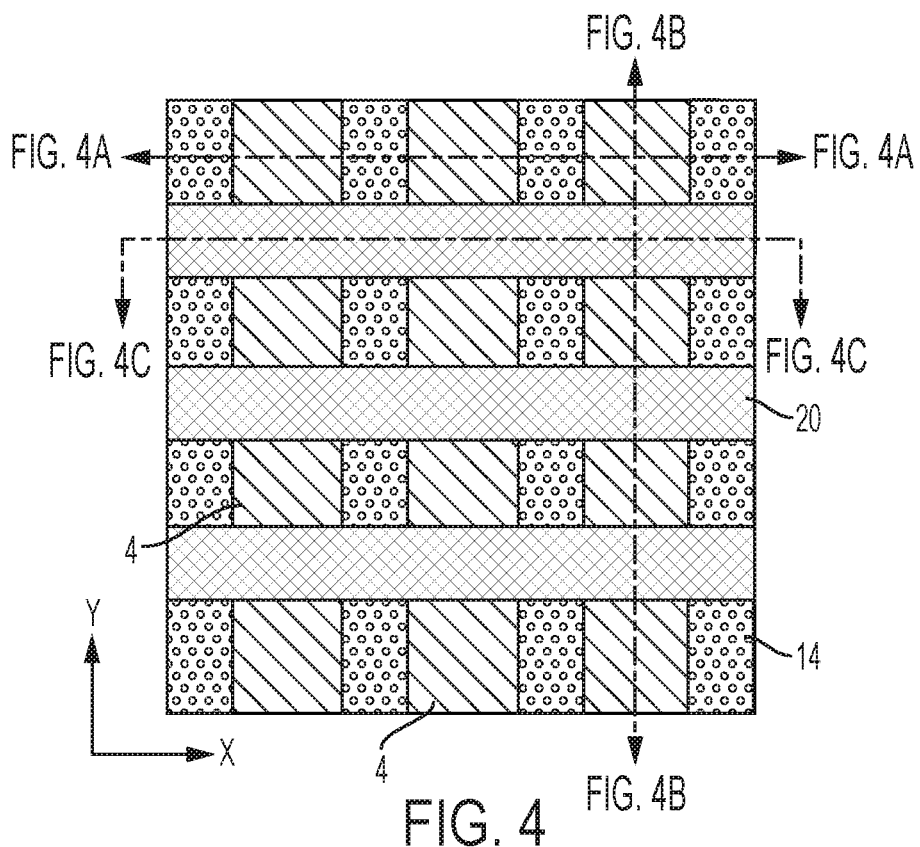
Figure 4A:
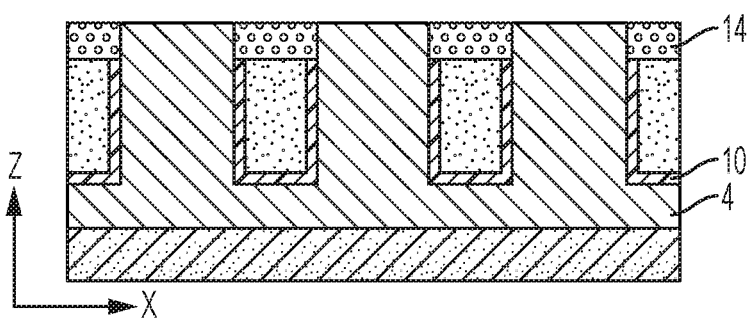
FIG. 4A is a cross-sectional view at line F4A of FIG. 4 in the x-z plane.

A portion of the bottom electrode can then be removed, for example, by etching and a cap material can be deposited to form cap 14 as illustrated in FIG. 4A. The etching can include reactive ion etching. The cap material can include an oxide (for example, silicon dioxide), an oxynitride (for example, silicon oxynitride), or a nitride (for example, silicon nitride). The cap material can include methyl silsesquioxane (MSQ), hydrogen silsesquioxane (HSQ), SiOF, and the like, or a combination including at least one of the foregoing.

Figure 4B:
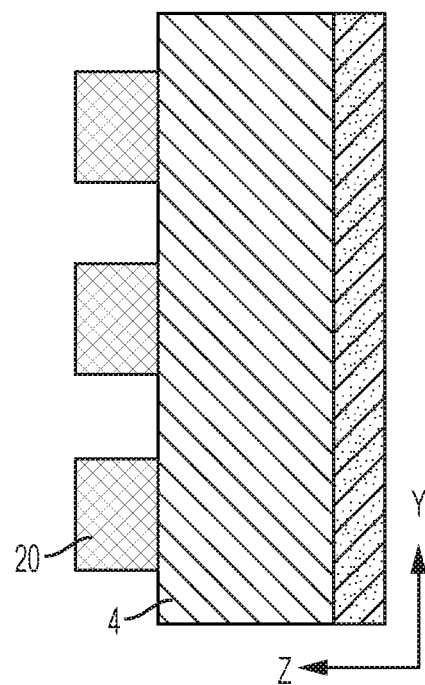
FIG. 4B is a cross-sectional view at line F4B of FIG. 4 in the y-z plane.
Figure 4C:
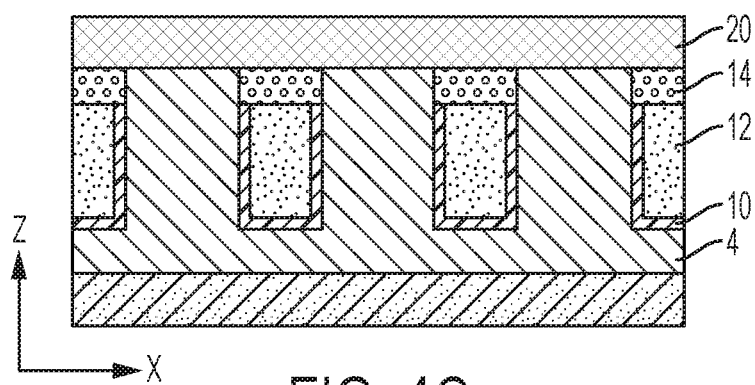
FIG. 4C is a cross-sectional view at line F4C of FIG. 4 in the x-z plane.

After the cap material is deposited, orthogonal mask 20 can be deposited on the surface to form a plurality of orthogonal mask lines. FIG. 4 is a top-down view of an x-y plane of the surface including the plurality of orthogonal mask lines, FIG. 4A is a cross-sectional view at line F4A of FIG. 4 in the x-z plane showing the absence of the orthogonal mask 20 at line F4A, FIG. 4B is a cross-sectional view at line F4B of FIG. 4 in the y-z plane, and FIG. 4C is a cross-sectional view at line F4C of FIG. 4 in the x-z plane showing the presence of the orthogonal mask 20 at line F4C. The orthogonal mask material can include a resist such as a photoresist and the underlayer material can be patterned by photolithography. An optional adhesion layer can be formed on top of the underlayer 4 prior to applying the mask material.

The unprotected underlayer regions can then be etched away in an etching operation, as illustrated in FIG. 5 to form top electrode regions 16. FIG. 5 illustrates a top-down view of an x-y plane of the surface after the etching. It is noted that the difference between the top surface of FIG. 4 and FIG. 5 is that the depth of underlayer 4 in FIG. 5 is greater than the depth of underlayer 4 in FIG. 4. This increased depth is illustrated in FIG. 5A and FIG. 5B. FIG. 5A is a cross-sectional view at line F5A in the x-z plane illustrating that underlayer 4 can be removed to a depth below the depth of the bottom electrode. FIG. 5B is a cross-sectional view at line F5B in the y-z plane illustrating that an amount of underlayer 4 is removed.

After forming top electrode regions 16, insulating layer 28 is deposited onto the surface followed by the deposition of top electrode conductive layer 30, for example, as illustrated in FIG. 6. FIG. 6 illustrates top-down view of an x-y plane of the surface after depositing top electrode conductive layer 30. FIG. 6 illustrates the relative heights of the top surface, where region I includes the orthogonal mask 20 and is the highest, region II is free of the orthogonal mask 20 and is therefore lower, and region III is in the etched region for forming the top electrode and is therefore the lowest. FIG. 6A is a cross-sectional view at line F6A in the x-z plane and FIG. 6B is a cross-sectional view at line F6B in the y-z plane. These figures illustrate that the insulating layer 28 is deposited on all exposed surfaces, followed by deposition of the top electrode conductive layer 30 on all exposed surfaces of the insulating layer 28.

The insulating layer 28 can have a thickness of 1 to 15 nanometers, specifically, 3 to 9 nanometers, more specifically, 4 to 7 nanometers. In some embodiments, RRAM insulating layer 28 is a high-k dielectric. In some embodiments, the insulating layer 28 is a transitional metal oxide. Examples of materials that can be suitable for RRAM dielectric include $NiO_X$, $Ta_yO_X$, $TiO_X$, $HfO_X$, $Ta_yO_X$, $WO_X$, $ZrO_X$, $Al_yO_X$, $SrTiO_X$, or a combination including at least one of the foregoing.

The top electrode conductive layer 30 can have a thickness of 1 to 10 nanometers, specifically, 2 to 6 nanometers or 1 to 3 nanometers. The top electrode conductive layer 30 can include a stack structure of metal nitride (for example, titanium nitride, tantalum nitride, or tungsten nitride), Al-containing alloy (for example, TiAl, TiAlC, TaAl, or TaAlC), titanium, tantalum, or a combination including at least one of the foregoing. Specifically, the top electrode conductive layer 30 can include a stack structure of titanium nitride and TiAlC.

FIG. 7 illustrates that top electrode metal layer 32 can then be deposited on the surface. FIG. 7 illustrates top-down view of an x-y plane of the surface after depositing top electrode metal layer 32. FIG. 7A is a cross-sectional view at line F7A in the x-z plane and FIG. 7B is a cross-sectional view at line F7B in the y-z plane.

The top electrode layer can include titanium, tantalum, tungsten, molybdenum, platinum, hafnium, copper, aluminum, gold, nickel, iridium, or a combination including at least one of the foregoing; specifically, tungsten.

Figure 8:
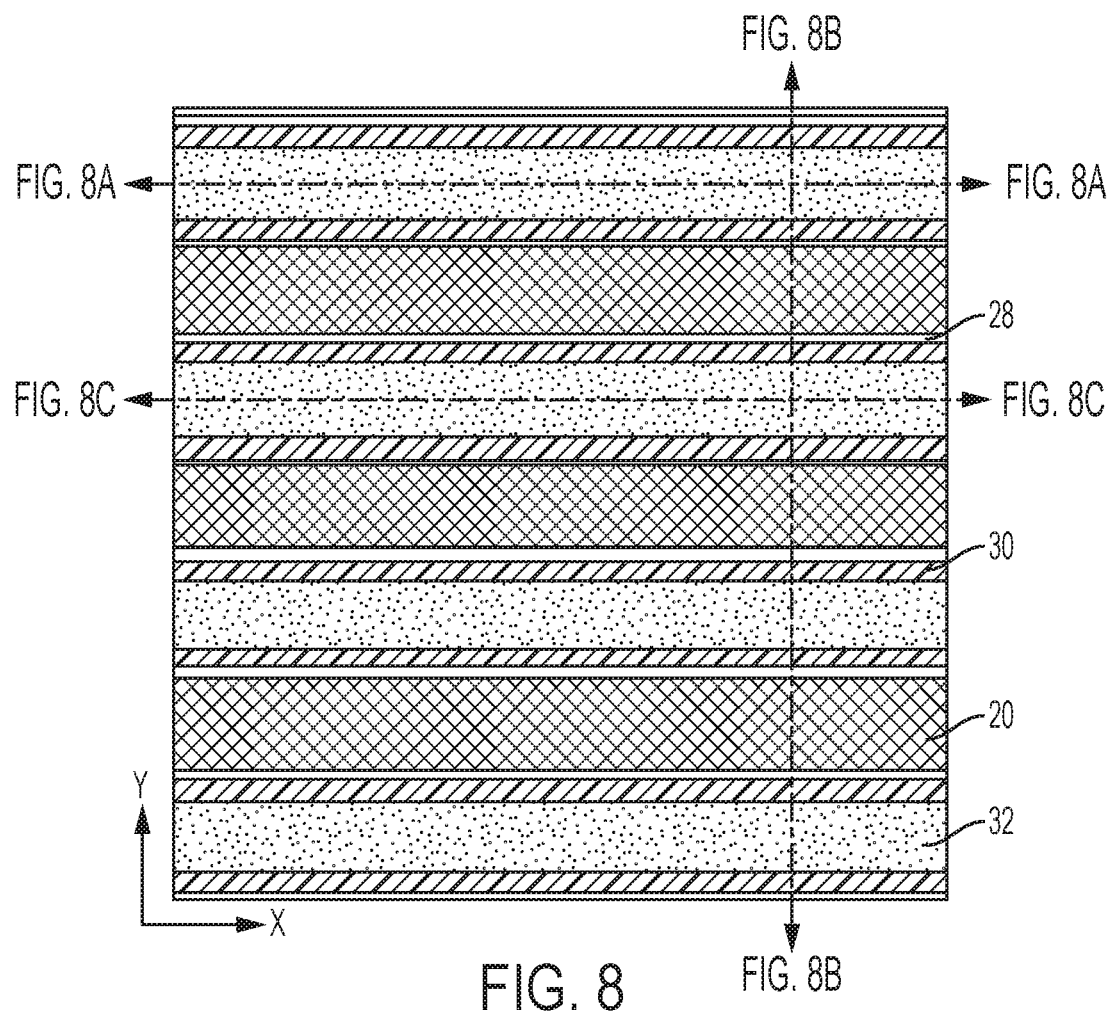
Figure 8A:
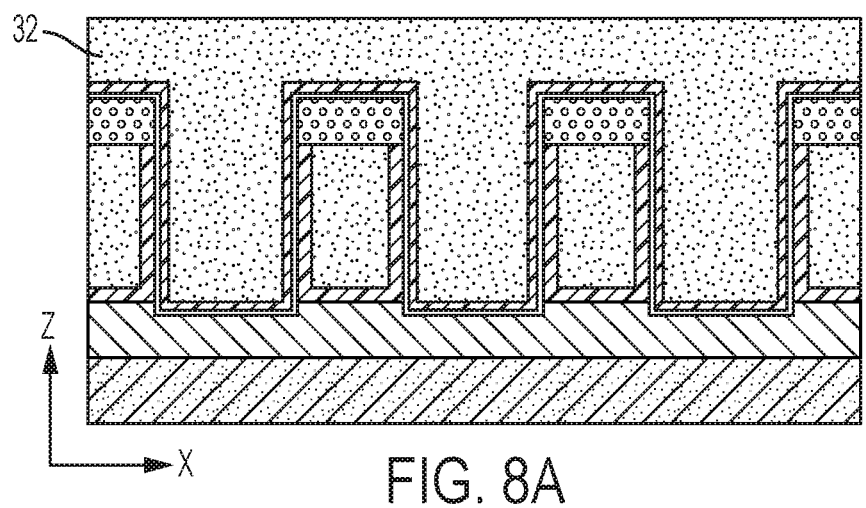
FIG. 8A is a cross-sectional view at line F8A of FIG. 8 in the x-z plane.
Figure 8B:
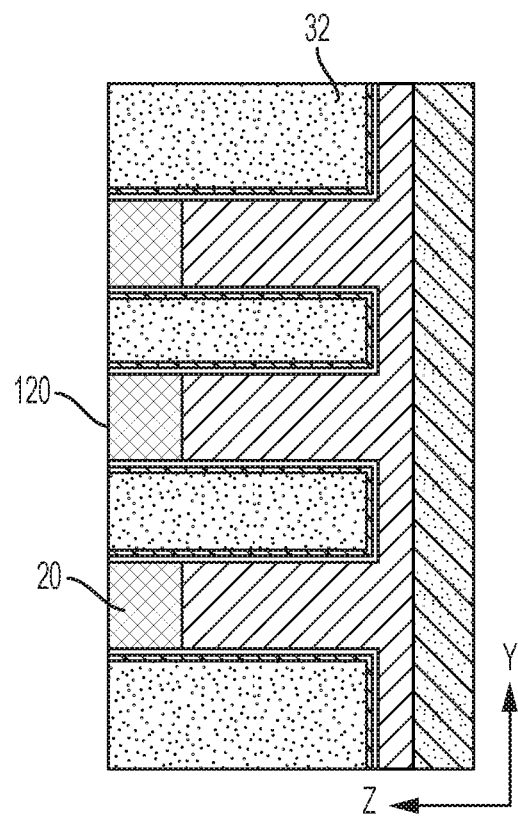
FIG. 8B is a cross-sectional view at line F8B of FIG. 8 in the y-z plane.
Figure 8C:
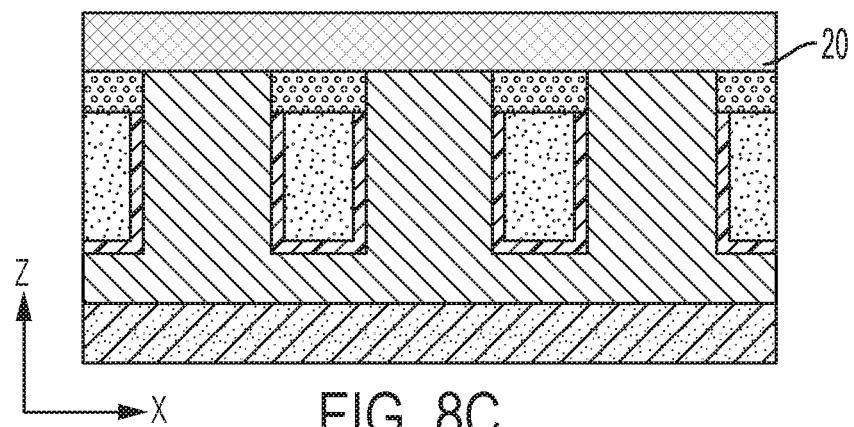
FIG. 8C is a cross-sectional view at line F8C of FIG. 8 in the x-z plane.

The surface can then undergo a chemical mechanical planarization to planarize the surface and to expose upper surface 120 of orthogonal mask 20. FIG. 8 illustrates top-down view of an x-y plane of the surface after the planarization, where FIG. 8A is a cross-sectional view at line F8A in the x-z plane and FIG. 8B is a cross-sectional view at line F8B in the y-z plane. FIG. 8 illustrates the top surface in the x-y plane has an upper surface 120 including alternating lines orthogonal mask 20, insulating layer 28, top electrode conductive layer 30, and top electrode metal layer 32 extending in the x-direction. FIG. 8A and FIG. 8C are cross-sectional views at line F6A and line F6C, illustrating the bottom electrode extends under the plane of the top surface in the y-direction. Here, two vertical sidewalls, making up separate RRAM cells are located at the cross-sections of each of the bottom electrodes and the top electrodes.

Figure 9:
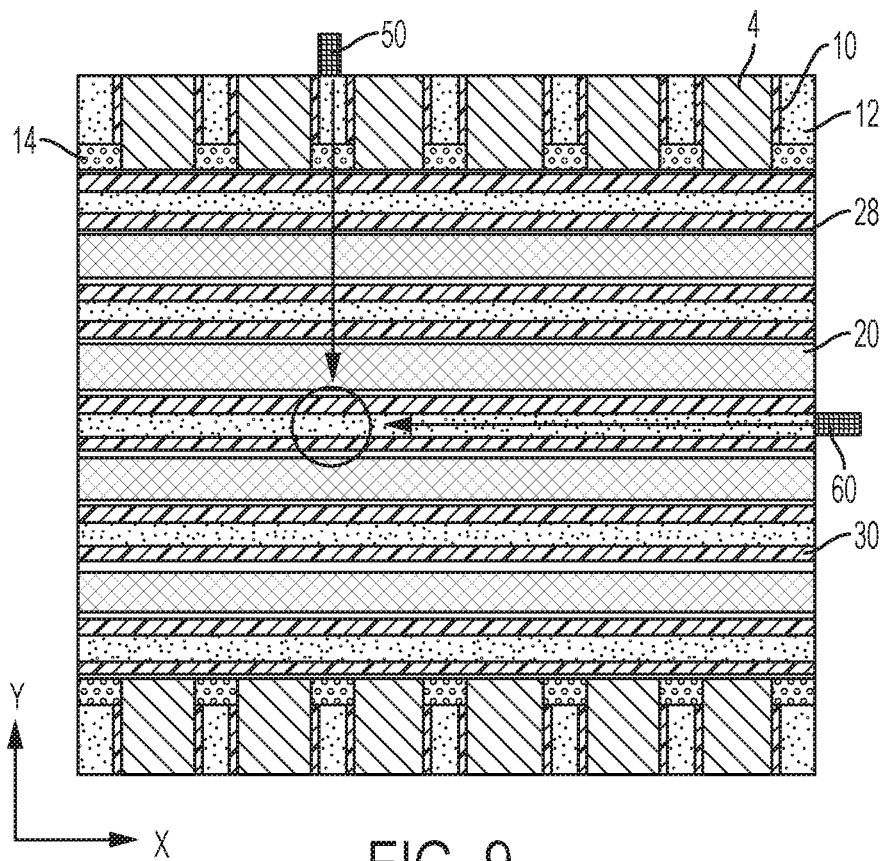

In the device, each of the bottom electrodes can represent a word line and each of the top electrodes can respective a bit line. For example, FIG. 9 illustrates interaction of word line 50 and bit line 60 at an encircled cell. The word lines and the bit lines can be arranged at equal intervals. The word lines can each independently be connected to a first decoder part. The bit lines can each independently be connected to a second decoder part. The decoder parts can function to activate a respective word or bit line as desired. As the cells can be optionally controlled independently from each other, therefore, if a bad cell occurs, it can be isolated from the remaining cells. Thus, a highly integrated semiconductor memory device can be realized.

The semiconductor memory devices according to the aforementioned example embodiments can be encapsulated using various packaging techniques. For example, the semiconductor memory devices according to the aforementioned example embodiments can be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (S SOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The semiconductor memory device can be a magnetoresistive random access memory, a phase change random access memory, a conductive bridging random access memory, or a resistive random access memory, specifically, a resistive random access memory.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that includes a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both an indirect "connection" and a direct "connection."

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular. "Or" means "and/or". It will also be understood that when an element, such as a layer, region, or substrate is referred to as being "on" or "over" another element, it can be directly on the other element or intervening elements can also be present.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of this invention.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor memory device comprising:
    a bottom electrode on a first portion of an underlayer of a substrate, the bottom electrode extending in a y-direction relative to a top surface of the substrate;
    a top electrode over a second portion of the underlayer, the top electrode extending in an x-direction relative to the top surface of the substrate, the second portion of the underlayer recessed below a bottommost surface of the bottom electrode;
    an insulating layer positioned between the bottom electrode and the top electrode and on the recessed second portion of the underlayer below the bottommost surface of the bottom electrode;
    wherein an active area for a memory cell of the semiconductor memory device is defined by a first sidewall of the bottom electrode, a second sidewall of and the top electrode, and a portion of the insulating layer between the first sidewall and the second sidewall, the first sidewall and second sidewall extending in a z-direction with respect to the top surface of the substrate; and
    wherein a bottommost surface of the top electrode contacts the insulating layer on the recessed second portion of the underlayer.

2. The device of claim 1 further comprising a plurality of the bottom electrodes and a plurality of the top electrodes.

3. The device of claim 1, wherein the bottom electrode comprises a bottom electrode conductive layer and a bottom electrode metal layer; wherein the bottom electrode conductive layer is located in between the insulating layer and the bottom electrode metal layer.

4. The device of claim 3, wherein the bottom electrode conductive layer comprises a metal nitride, a doped semiconductor material, a metal-semiconductor compound, or a combination comprising at least one of the foregoing; and/or wherein a thickness of the bottom electrode conductive layer is 1 to 10 nanometers.

5. The device of claim 3, wherein the bottom electrode metal layer comprises titanium, tantalum, tungsten, molybdenum, platinum, hafnium, copper, aluminum, gold, nickel, iridium, or a combination comprising at least one of the foregoing.

6. The device of claim 1, wherein the top electrode comprises a top electrode conductive layer and a top electrode metal layer; wherein the top electrode conductive layer is located in between the insulating layer and the top electrode metal layer.

7. The device of claim 6, wherein the top electrode conductive layer comprises a metal nitride, an Al-containing alloy, titanium, tantalum, or a combination including at least one of the foregoing; and/or wherein a thickness of the top electrode conductive layer is 1 to 10 nanometers.

8. The device of claim 6, wherein the top electrode metal layer comprises titanium, tantalum, tungsten, molybdenum, platinum, hafnium, copper, aluminum, gold, nickel, iridium, or a combination comprising at least one of the foregoing.

9. The device of claim 1 further comprising a cap located on an upper surface of the bottom electrode.

10. The device of claim 9, wherein the cap comprises an oxide, an oxynitride, a nitride, methyl silsesquioxane, hydrogen silsesquioxane, SiOF, or a combination comprising at least one of the foregoing.

11. The device of claim 1, wherein the insulating layer comprises an oxide of a transition metal.

12. The device of claim 11, wherein the insulating layer comprises the high dielectric constant material and wherein the high dielectric constant material comprises $NiO_X$, $Ta_yO_X$, $TiO_X$, $HfO_X$, $Ta_yO_X$, $WO_X$, $ZrO_X$, $Al_yO_X$, $SrTiO_X$, or a combination comprising at least one of the foregoing.

13. The device of claim 1, wherein a thickness of the insulating layer is 1 to 15 nanometers.

14. The device of claim 1, wherein the device is a resistive random access memory device.

* * * * *